(12) United States Patent
Meinhardt et al.

(10) Patent No.: US 7,618,871 B2
(45) Date of Patent: Nov. 17, 2009

(54) METHOD FOR THE PRODUCTION OF A BIPOLAR TRANSISTOR COMPRISING AN IMPROVED BASE TERMINAL

(75) Inventors: Gerald Meinhardt, Graz (AT); Jochen Kraft, Oberaich (AT)

(73) Assignee: Austriamicrosystems AG, Unterpremstatten (AT)

( * ) Notice: Subject to any disclaimer, the term of this patent is extended or adjusted under 35 U.S.C. 154(b) by 0 days.

(21) Appl. No.: 10/593,141

(22) PCT Filed: Jan. 19, 2005

(86) PCT No.: PCT/EP2005/000500

§ 371 (c)(1),
(2), (4) Date: Jul. 25, 2007

(87) PCT Pub. No.: WO2005/098926

PCT Pub. Date: Oct. 20, 2005

(65) Prior Publication Data

US 2007/0269953 A1 Nov. 22, 2007

(30) Foreign Application Priority Data

Mar. 18, 2004 (DE) .................... 10 2004 013 478

(51) Int. Cl.
*H01L 21/331* (2006.01)
(52) U.S. Cl. ............... 438/309; 438/345; 257/E21.379; 257/E29.044

(58) Field of Classification Search ................. 438/309, 438/318, 345; 257/E21.379, E29.044, E29.183
See application file for complete search history.

(56) References Cited

U.S. PATENT DOCUMENTS 3,886,569 A 5/1975 Basi et al.

(Continued)

FOREIGN PATENT DOCUMENTS

DE 198 40 866 A1 3/2000

(Continued)

OTHER PUBLICATIONS

Kravetsky et al., "A study of ion-implanted Si(111) and Si(111)/silicon oxide by optical second harmonic generation", Surface Science, vol. 402-404, No. 15, pp. 542-546, May 15, 1998.

(Continued)

*Primary Examiner*—Walter L Lindsay, Jr.
(74) *Attorney, Agent, or Firm*—Cohen Pontani Lieberman & Pavane LLP

(57) ABSTRACT

For the production of an improved bipolar transistor comprising a low-resistance base terminal, a dielectric layer is deposited over the semiconductor substrate and is highly doped via an implantation mask. In a subsequent controlled thermal step, the dopant is then indiffused into the semiconductor substrate from the dielectric layer serving as a dopant repository. This gives rise to a low-resistance region with which the extrinsic base can be defined carefully.

14 Claims, 3 Drawing Sheets

U.S. PATENT DOCUMENTS

| | | | | |
|---|---|---|---|---|
| 6,028,345 | A | * | 2/2000 | Johnson ..................... 257/592 |
| 6,239,477 | B1 | | 5/2001 | Johnson |
| 6,248,650 | B1 | | 6/2001 | Johnson |
| 6,440,810 | B1 | * | 8/2002 | Johansson et al. ........... 438/309 |
| 6,686,250 | B1 | * | 2/2004 | Kalnitsky et al. ........... 438/345 |
| 7,390,721 | B2 | * | 6/2008 | Geiss et al. ................. 438/312 |
| 2001/0012655 | A1 | * | 8/2001 | Nordstom et al. ........... 438/239 |
| 2002/0003286 | A1 | | 1/2002 | Marty et al. |
| 2002/0132435 | A1 | | 9/2002 | Zampardi et al. |
| 2004/0043576 | A1 | * | 3/2004 | Shideler et al. ............. 438/312 |
| 2006/0060941 | A1 | * | 3/2006 | Sun et al. .................... 257/557 |

FOREIGN PATENT DOCUMENTS

| | | |
|---|---|---|
| EP | 0 219 243 A | 4/1987 |
| EP | 219243 A2 * | 4/1987 |
| EP | 0 430 274 A2 | 11/1990 |
| JP | 03265131 A | 11/1991 |
| JP | 05110079 A | 4/1993 |
| WO | WO 00/13206 | 3/2000 |
| WO | WO 2005098926 A1 * | 10/2005 |

OTHER PUBLICATIONS

Böck, J. et al., "SiGe Bipolar Technology for Mixed Digital and Analogue R Applications", IEEE 2000, pp. 32.3.1-32.3.4.

Baudry, H. et al., "High performance O.25μm SiGe and SiGe:C HBTs using non selective epitaxy", IEEE BCTM 3.1, 2001, pp. 52-55.

Johnson, F.S. et al., "A Highly Manufacturable 0.25μm RF Technology Utilizing a Unique SiGe Integration", IEEE BCTM 3.2, 2001, pp. 56-59.

Richey, D.M. et al., "Scaling Issues and Ge Profile Optimization in Advanced UHV/CVD SiGe HBTs", IEEE BCTM 1.2, 1996, pp. 19-22.

Böck, J. et al., "SiGe Bipolar Technology for Mixed Digital and Analogue RF Applications", IEEE 2000, pp. 32.3.1-32.3.4.

Baudry, H. et al., "High performance 0.25 μm SiGe and SiGe:C HBTs using non selective epitaxy", IEEE BCTM 3.1, 2001, pp. 52-55.

Johnson, F.S. et al., "A Highly Manufacturable 0.25 μm RF Technology Utilizing a Unique SiGe Integration", IEEE BCTM 3.2, 2001, pp. 56-59.

Richey, D.M. et al., "Scaling Issues and Ge Profile Optimization in Advanced UHV/CVD SiGe HBTs", IEEE BCTM 1.2, 1996, pp. 19-22.

* cited by examiner

METHOD FOR THE PRODUCTION OF A BIPOLAR TRANSISTOR COMPRISING AN IMPROVED BASE TERMINAL

RELATED APPLICATIONS

This is a U.S. national stage of International Application No. PCT/EP2005/000500, filed on Jan. 19, 2005.

This patent application claims the priority of German patent application no. 10 2004 013 478.2. filed Mar. 18, 2004, the disclosure content of which is hereby incorporated by reference.

FIELD OF THE INVENTION

The invention relates to a method for the production of a bipolar transistor comprising an emitter, a collector and comprising a base layer divided into an intrinsic base and an extrinsic base, and to a method for the production of the transistor.

BACKGROUND OF THE INVENTION

The document "SiGe Bipolar Technology for Mixed Digital and Analog RF Applications", J. Bock et al. IEEE 2000 discloses transistors of the type mentioned in the introduction in which the base layer has an intrinsic section and an extrinsic section, the extrinsic section connecting a base contact to the intrinsic section. In this case, the extrinsic section has a relatively low boron doping. This results in the disadvantage of a high resistance of the base layer and leads to a reduction of the power gain even at relatively low frequencies and thus to an effective slowing down of the transistor. In addition, the higher base lead resistance brings about higher noise.

U.S. Pat. No. 6,028,345 B1 discloses a method for the production of a transistor comprising an extrinsic base doped in low-resistance fashion, in which a glass layer is deposited in highly doped fashion in the region of the extrinsic base, dopant being driven into the extrinsic base from said glass layer in a thermal step. This method has the disadvantage that the deposition of a sufficiently highly doped layer in a CVD process poses problems.

SUMMARY OF THE INVENTION

Therefore, it is an object of the present invention to specify a method of the type mentioned in the introduction by means of which a low-resistance base terminal can be produced in a simple manner and which can be carried out simply and in controlled fashion.

This and other objects are attained in accordance with one aspect of the invention directed to a method for the production of a bipolar transistor comprising a highly doped extrinsic base. The method comprises providing a base layer on a semiconductor substrate, depositing a dielectric layer in weakly doped or undoped fashion on the base layer, applying an implantation mask and patterning in such a way that an opening remains in a region provided for a later extrinsic base, introducing a dopant of a first conductivity type into the dielectric layer after the application of the mask, using $BF_2$ as the dopant and indifussing, in a controlled thermal step, the dopant into the semiconductor substrate from the dielectric layer, an extrinsic base doped in low-resistance fashion arising.

The invention likewise utilizes the principle of a differential base, firstly a customarily weakly doped, crystalline semiconductor layer being provided as base layer. A region of said base layer which is provided for the later extrinsic base is doped more highly by indiffusion of a dopant of the first conductivity type from a dielectric layer deposited thereabove, so that a low-resistance base terminal can be realized therefrom. The low resistance of the base terminal or of the extrinsic base enables a transistor having only short switching times or having a high maximum switching frequency. Since the intrinsic base has a lower doping than the extrinsic base, the disadvantages associated with a high doping are avoided. In particular, the tunneling current between a later highly doped emitter and the (here not) highly doped intrinsic base is thereby suppressed.

According to an embodiment of the invention, however, the dielectric layer is not doped until after the deposition. This makes it possible to introduce a high dopant dose into the dielectric layer, and the thickness of said layer can be kept small. From a thin dopant-containing layer, in turn, the dopant can be outdiffused into the base layer in a much more controlled manner than from a thicker layer. In the case of the latter, the boundaries of the doping zone thus produced in the base layer would be more diffuse and the extent of the doping zone would be more difficult to control.

Compared with known methods for the implantation of dopant directly into the base layer, diffusion from the dopant-containing dielectric layer has the advantage that in this case no implantation-dictated defects and impurities arise in the base layer which could promote diffusion over and above the desired amount and would thus yield results difficult to reproduce.

The transistor produced according to an embodiment of the invention is preferably formed as an npn bipolar transistor. This means that the base layer just like the dielectric layer is p-doped, or that the dopant of the first conductivity type may produce a p-type doping, whereas the dopant of the second conductivity type may produce an n-type doping.

However, it is also possible to form the transistor according to the invention as a pnp bipolar transistor.

An oxide layer is preferably deposited as a dielectric layer over the base layer, for example in a CVD method. This layer has the advantage that a sufficiently high dopant dose can be introduced and that its dielectric properties are maintained even when there is a high content of dopant.

$BF_2$ is preferably introduced as the dopant. $BF_2$ has the advantage that its penetration depth can be controlled well during introduction by means of implantation into the dielectric layer.

The introduction of the dopant, and in particular the introduction of $BF_2$ into the dielectric layer is effected over the whole area or with the aid of an implantation mask which covers the area regions of the dielectric layer from which no dopant is to be diffused into the underlying base layer. In particular, the implantation mask has an opening in the region of the extrinsic base, while it covers the region of the intrinsic base, so that no (additional) dopant can be introduced there. In the case of whole-area introduction of dopant into a dielectric layer applied over a large area, a patterning is subsequently effected, the base layer being uncovered for the emitter in a window.

The implantation mask may be applied on a continuous dielectric layer. Preferably, at least one emitter window that defines the later emitter/base contact is opened beforehand in the dielectric layer. The emitter is produced directly afterward by depositing an emitter layer over the whole area and patterning it in order not to damage the semiconductor substrate of the base that is uncovered in the emitter window during the implantation.

For the emitter layer, a semiconductor layer is applied, in particular a polycrystalline, amorphous or monocrystalline layer, which is doped with a dopant of the second conductivity type. However, it is also possible to permit the emitter layer to grow epitaxially. The emitter layer is subsequently patterned.

The implantation mask may then be produced over the emitter layer or the patterned emitter and comprises for example a photoresist layer and, if appropriate, further layers arranged below the latter, for example oxide and/or nitride layers. For patterning the emitter, use is preferably made of a photoresist layer which initially remains on the emitter and can later be used as an implantation mask for the doping of the dielectric layer.

The starting point for the production of the semiconductor substrate is preferably a semiconductor wafer, for example a silicon wafer having weak doping of the first conductivity type. The collector is produced therein, for example by additional implantation of dopants for producing a heavily doped collector zone of the second conductivity type. However, it is possible, for the collector as well, to permit a semiconductor layer to grow epitaxially on the semiconductor wafer. Said layer can be doped in situ in the course of growth. However, it is also possible for such an epitaxial layer to be doped subsequently. Prior to the epitaxy, a buried layer is produced for the deeply situated collector connection zone. Well-type zones—wells—are subsequently produced by doping and subsequent diffusion and activation.

In the next step, the active transistor regions may be defined by isolating individual transistor regions from one another by means of oxide regions. Oxidic barrier layers, for example grown field oxide (LOCOS) or oxide-filled isolating trenches (STI=shallow trench isolation), are produced around the active transistor area. The oxide regions may also insulate the transistor regions from other regions on the surface of the semiconductor substrate. The active transistor region surrounded e.g. annularly by the insulating oxide regions has a diameter of e.g. 150 to 400 Å, remains free of oxide and forms the collector surface.

A semiconductor weakly doped with a dopant of the first conductivity type is subsequently deposited as a base layer over the semiconductor wafer with the defined transistor regions. The growth or deposition is effected under epitaxial conditions, the base layer likewise growing in monocrystalline fashion directly over a crystalline substrate material, while it grows in polycrystalline or amorphous form over the oxide regions or other noncrystalline regions. In this case, it is possible, prior to the epitaxy, to apply and pattern further dielectric intermediate layers between the semiconductor wafer and the epitaxial base layer. Said intermediate layers may serve for additional electrical insulation of the base layer from the semiconductor wafer. The intermediate layer or intermediate layers is or are then patterned such that a corresponding opening is provided at least in the active transistor region.

The base layer is preferably deposited with a layer thickness of e.g. 1000 to 2000 angstroms. The thickness of the electrically active base in the later bipolar transistor is significantly smaller, however, and amounts e.g. to only a fifth to a third of the original thickness of the base layer. If the later base/emitter junction is not produced at the interface of the base layer, but rather is shifted deeper into the base layer, then this is taken into account in the thickness of the base layer during deposition by means of a corresponding layer thickness reserve.

As just explained, the epitaxially grown base layer advantageously constitutes the topmost semiconductor layer of the semiconductor substrate, to which the dielectric layer is then applied directly, preferably in undoped fashion. However, it is also possible to produce a doping profile of boron, for example, in the base layer as early as in the course of growth. However, the base may also be defined without epitaxy by means of corresponding doping directly in the surface of a semiconductor wafer.

Relative to the thickness of the base layer, the overlying dielectric has only a small layer thickness. This is possible since the introduction of the dopant into the dielectric layer can be effected in a controlled manner such that the dopant is only introduced down to a specific maximum depth corresponding to the thickness of the dielectric layer. This is achieved particularly when $BF_2$ is used as the dopant. In addition, it is possible to incorporate in or introduce into the dielectric layer a high dose of dopant which is sufficient for a high doping of the underlying base layer. This dopant repository within the dielectric layer is then situated exclusively in area regions over the later extrinsic base.

In a controlled thermal step, the dopant is subsequently indiffused into the base layer. By controlling the layer thickness of the dielectric layer and the amount of dopant therein it is possible to conduct the diffusion such that the dopant indiffuses into the base layer from the dielectric layer down to a desired depth. It is thereby possible to minimize an undesirable lateral diffusion of the dopant within the base layer, so that the dopant distribution originally predefined by the implantation mask can also be transferred to the base layer and thus leads to a desired patterning of the transistor. After the outdiffusion of the dopant from the dielectric layer or the indiffusion into the surface of the semiconductor substrate, and in particular into the base layer, the dielectric layer can be removed, for example by etching.

However, it is also possible to leave the dielectric layer on the extrinsic base and, in a later step, only to open a window for the base contact in the dielectric layer, by means of which the extrinsic base and hence also the active base can be connected.

The transistor may be formed from a uniform semiconductor material, for example from silicon. However, it may also be formed as a heterojunction bipolar transistor in which at least one of the layers, selected from emitter, base and collector, contains proportions of a further semiconductor, for example up to 40 atomic % of germanium. This proportion of germanium may be contained homogenously in the corresponding transistor layer or the corresponding transistor layer region. However, it is also possible to continuously vary the germanium content in a transistor layer and to permit it to rise for example in the direction of a pn junction. Since germanium has a different bandgap than silicon, the semiconducting properties, in particular the local bandgap, can thus be set to the desired value by way of the germanium content or by way of the content of a different or a further semiconductor. While the collector and base are preferably formed in monocrystalline fashion, the emitter may also be polycrystalline or amorphous. However, it is possible also to permit the emitter to grow epitaxially.

Individual or a plurality of transistor layers and, if appropriate, the layer provided with germanium may have, besides the dopant and the second semiconductor possibly present, even further dopings that determine the properties of the semiconductor. Thus, individual or a plurality of the transistor layers may have a defined content of carbon and/or nitrogen.

DETAILED DESCRIPTION OF THE DRAWINGS

Proceeding from a semiconductor wafer HLW, for example a p-doped silicon wafer, firstly a buried layer is produced for the deeply situated collector connection by implantation of a substance that produces an n-type conductivity, for example phosphorus, and subsequent epitaxial growth of the collector zone K. This is followed by the production and activation of a doping for the wells. The active transistor regions TB are then produced. This is preferably effected by local oxidation and growth of field oxide. The individual transistors on the large-area semiconductor wafer HLW are then insulated from one another by the corresponding oxide regions OB. With the aid of the oxide regions, the transistors can also be insulated from other structures and circuit elements that are additionally integrated on the semiconductor wafer.

Figure 1:
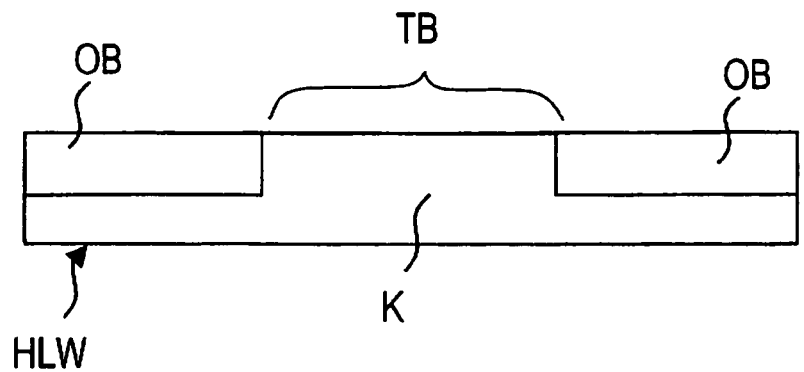
FIGS. 1 to 6 show different method stages in the production of the bipolar transistor according to the invention on the basis of schematic cross sections through the wafer and the construction applied thereto.

FIG. 1 shows the arrangement after the definition of the transistor regions. At this stage a conductive connection to the collector connection zone can also be created outside the active transistor zone by a doping technique referred to as a sinker. With this technique, a dopant is introduced into a semiconductor body at a first depth. By diffusing the dopant down until it reaches a second depth, the volume of the doped region can be enhanced such that the doping reaches a desired region at the second depth. In the invention, the sinker can be used to create an electrically conductive connection from the surface of the semiconductor body to the collector formed as a buried layer at the second depth. The collector connection KA shown in FIG. 7 can be produced by a sinker.

A base layer BS is subsequently grown under epitaxial conditions directly over the active transistor regions TB and the oxide regions OB adjacent thereto. For this purpose, use is preferably made of a low temperature PE-CVD (plasma enhanced CVD) method or an LP-CVD (low pressure CVD) method in which the base layer can grow in monocrystalline modification at least in the region over the crystalline substrate, that is to say in the region of the intrinsic base. In this case, the base layer is lightly p-doped in situ, preferably with a given dopant content that varies over the layer thickness, for example by direct incorporation of boron during growth.

Figure 2:
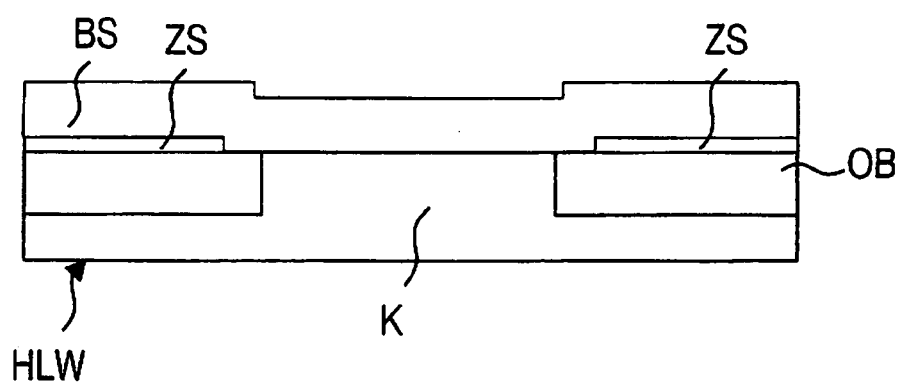

FIG. 2 shows a variant of the method in which at least one electrically insulating intermediate layer ZS is additionally applied over the semiconductor wafer prior to the growth of the base layer BS. The purpose of the intermediate layer can be to define a step on top of the semiconductor wafer for helping to differentiate between the extrinsic base and transistor region TB during epitaxial deposition of the base layer. Further, the intermediate layer can provide a desired surface material or surface property different from that of the oxide regions OB. The intermediate layer is patterned in such a way that at least the transistor region TB remains uncovered. On account of the varying crystal modification and the intermediate layer possibly present, corresponding steps can form in the base layer. FIG. 2 shows the arrangement after this method step.

Figure 3:
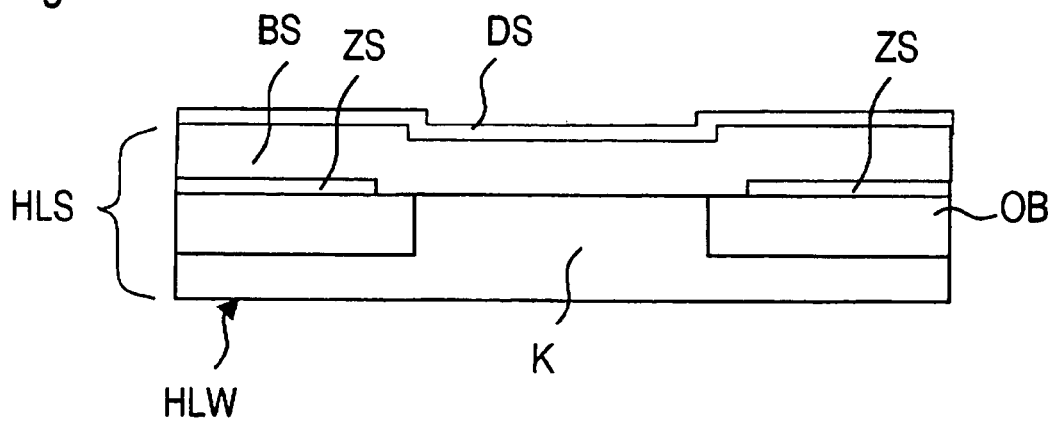

A dielectric layer DS is subsequently deposited directly onto the base layer BS, for example an oxide layer in a CVD method (see FIG. 3).

Figure 4:
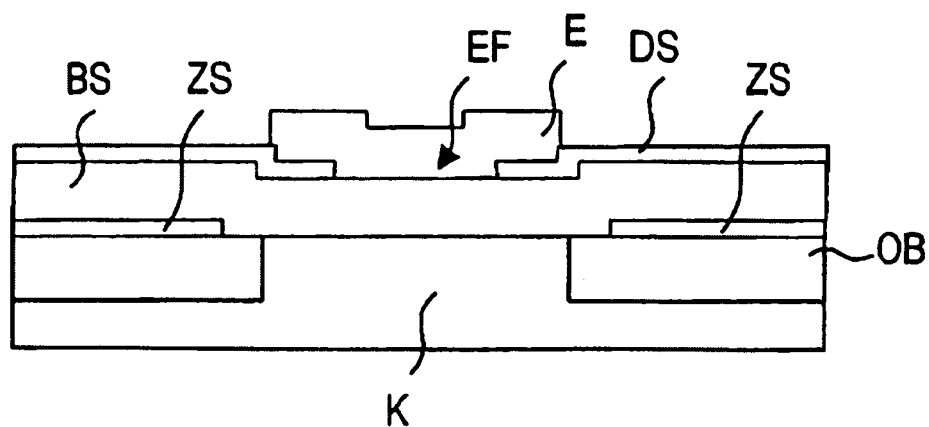

In accordance with one variant, the dielectric layer DS is subsequent patterned and an emitter window EF is opened in the process. Over that an emitter layer heavily doped with a dopant of the second conductivity type, and in particular with arsenic, is then applied over the whole area. Preferably, a further layer of a dielectric, and in particular an oxide layer, is produced over that to help structure the emitter layer thereby preventing the emitter from getting doped or damaged during implantation of dopants into the dielectric layer DS. The emitter layer is subsequently patterned with the aid of a photoresist mask, the desired emitter E remaining. However, the latter is not identical with the later electrically active emitter located in the crystalline zone of the base layer after diffusion. FIG. 4 shows the arrangement after this method stage. A diffusion process drives dopants out of the emitter into the base layer such the "electrically active emitter" is not exactly at the boundary between emitter layer and base layer, but is in the base layer near that boundary. The electrically active emitter is at or near the semiconductor junction between emitter and base which is labelled EBU in FIG. 7. Because of diffusion, EBU is spaced from the layer interface.

Figure 5:
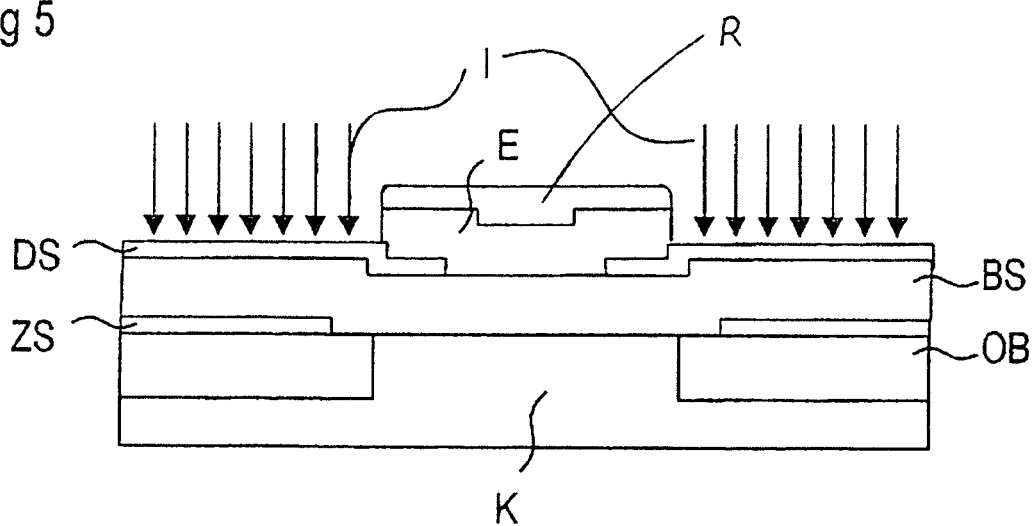

The next step involves introducing dopant into the dielectric layer DS with the aid of an implantation mask R (FIG. 5). The photoresist mask which remained above the emitter and with the aid of which the emitter E has already been patterned is preferably used for this purpose. The method thus becomes self-aligning relative to the structure of the emitter. Otherwise, an implantation mask R is used or produced which has openings S at the locations into which the dopant is subsequently to be introduced (indicated by the arrows I).

The introduction of dopant into the dielectric layer DS is preferably effected by implantation, and in particular by implantation of $BF_2$. This is indicated by the arrows I in FIG. 5. The implantation conditions are chosen such that the maximum implantation depth of the dopant is under no circumstances greater than the layer thickness of the dielectric layer. This prevents imperfections from arising in the base layer BS.

In the next step, the dopant is transferred from the dielectric layer DS into the base layer BS by setting the desired diffusion conditions. The outdiffusion of boron from the dielectric layer DS into the underlying section of the base layer BS is effected at normal pressure under inert conditions, for example in an RTP (rapid thermal processing) installation at a temperature of 960-1020° C. for a duration of 5-30 s. In this way, a highly doped extrinsic base is obtained, while the intrinsic base retains its original doping.

Figure 6:
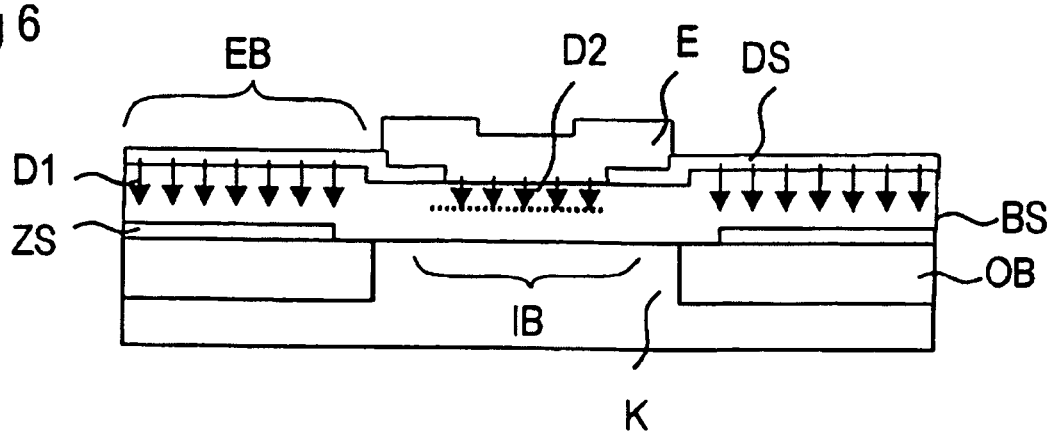

At the same time as the diffusion of the boron from the dielectric layer, dopants of the second conductivity type also diffuse from the emitter into the base layer BS. The emitter is preferably n-doped with arsenic, which is distinguished by a lower diffusion rate compared with the more mobile boron. It is thereby possible for the boron to be permitted to indiffuse down to a greater depth corresponding e.g. to the layer thickness of the base layer BS. By contrast, arsenic is indiffused to only a smaller maximum depth, which is indicated by a dotted line in FIG. 6. In this case, the semiconductor junction between the p-conducting base layer and the n-doped emitter is simultaneously also shifted into the monocrystalline base layer BS as far as said line. What is thereby achieved is that the emitter/base junction is remote from the imperfections existing at layer boundaries of base layer/emitter layer.

As a result of the entire diffusion operation, the base layer is highly doped and thus acquires low resistance in the region of the extrinsic base EB. The intrinsic base IB, which provides the actual base function in the bipolar transistor, is left in the remaining predominantly monocrystalline region of the base layer BS. The intrinsic (active) base IB is electrically connected via the extrinsic base EB, which, as a result of the high doping, ensures a high conductivity and thus a low-resistance base terminal. Between the active base, which strictly is defined by the emitter-base junction, and the extrinsic base EB there remains a safety clearance that is minimized in the method according to the invention. While the active base needs a low doping concentration to guarantee good electrical transistor properties the extrinsic base has to be doped very high to minimize its resistance. Thus, a given distance (safety clearance) has to be maintained between the active base and the extrinsic base such that the active base is not deteriorated by dopants from the extrinsic base. As this distance (safety clearance) has a doping concentration smaller than that of the extrinsic base, it has a higher resistance that forms the major part of the total resistance of the base terminal. By reducing the length of the safety clearance the total resistance of the base terminal can be reduced and the switching speed and switching frequency of the transistor can be enhanced.

Figure 7:
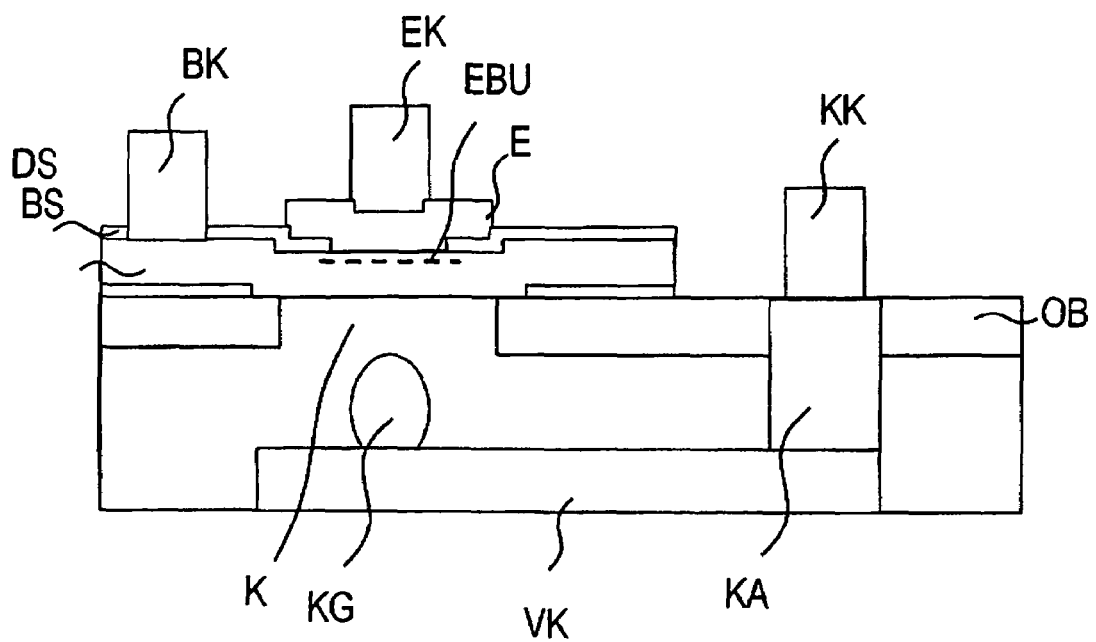
FIG. 7 shows a finished bipolar transistor in schematic cross section.

FIG. 7 shows a finished bipolar transistor, in which, in comparison with the previous arrangement the contacts for the connection of the individual transistor layers have now also been produced. By way of example, an emitter contact EK is produced directly above the emitter E, said emitter contact being formed from polysilicon or a metal, in particular from aluminum, tungsten or copper. In the region of the extrinsic base EB, above the base layer in the dielectric layer DS and the other layers optionally applied thereabove, in a window, the base layer BS is uncovered and the base contact BK is applied. The contact to the collector is implemented outside the transistor region. For this purpose, a collector connection KA highly doped with dopant of the second conductivity type is produced in the semiconductor substrate HLS. By means of the collector connection KA, contact is made with a deeply situated, highly doped buried collector layer VK, which is in turn connected to the collector zone KG and a selectively implanted collector zone KA. In this way, a continuously highly doped and thus low-resistance connection is produced via collector connection KA, buried collector layer VK and collector zone KG, which all have a high doping of the second conductivity type.

The transistor according to the invention is distinguished by an intrinsic base which can be kept relatively thin and the dopant distribution of which is defined by the epitaxial deposition. The small thickness enables rapid bridging of the intrinsic base by the charge carriers initiated by the emitter and thus short switching times of the transistor. Moreover, the intrinsic base is not widened by outdiffusion of its dopant elements, in particular the boron atoms, into adjacent layer regions of emitter or collector, as would be expected as a disadvantageous concomitant phenomenon particularly in the case of the known dopant implantation of the entire base layer. Overall a low-resistance connection of the intrinsic base and thus of the entire transistor is nevertheless made possible via the extrinsic base which has low resistance and thus good electrical conductivity as a result of the indiffusion of additional dopant. By means of the method according to the invention, the individual component parts of the transistor can be sufficiently separated without the resistance of the base terminal thereby being increased in comparison with known transistors. Therefore, a transistor according to the invention is suitable particularly for fast logic and analog circuits and permits a high switching frequency.

The distance between the highly doped extrinsic base and the emitter can be chosen with the aid of the method according to the invention such that, on the one hand, a low-resistance base terminal via the extrinsic base toward the emitter/base junction is possible and, on the other hand, the tunneling of charge carriers between the highly doped region of the base layer and the highly doped emitter is restricted to a desired value or decreased below a maximum value that can be afforded tolerance.

Although the method according to the invention has been able to be described only on the basis of a single exemplary embodiment, it is not at all restricted thereto. Rather, numerous modifications of the specified method parameters and in particular of the material selection lie within the scope of the invention.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. A method for the production of a bipolar transistor comprising a highly doped extrinsic base, wherein the method comprises the steps of:
   providing a base layer on a semiconductor substrate;
   depositing a dielectric layer in weakly doped or undoped fashion on the base layer;
   applying an implantation mask and patterning in such a way that an opening remains in a region provided for a later extrinsic base;
   introducing $BF_2$ as a dopant of a first conductivity type into the dielectric layer after the application of the mask; and
   indiffusing, in a controlled thermal step, the dopant into the semiconductor substrate from the dielectric layer, an extrinsic base doped in low-resistance fashion arising.

2. The method as claimed in claim 1, in which an oxide layer is deposited as the dielectric layer (DS).

3. The method as claimed in claim 1, in which an emitter window is opened in the dielectric layer.

4. The method as claimed in claim 3, in which before the dopant is introduced into the dielectric layer, the emitter is produced by application and patterning of a polycrystalline emitter layer doped with a dopant of the second conductivity type above the emitter window.

5. The method as claimed in claim 4, in which the emitter layer is patterned by means of a photopatterned resist mask that remains on the emitter and is later used as an implantation mask for the implantation of the dopant into the dielectric layer.

6. The method as claimed in claim 1, in which, for the production of the semiconductor substrate, in a semiconductor wafer doped with a dopant of the second conductivity type, active transistor regions are defined and are electrically insulated by oxide regions; and
   in which a base layer weakly doped with a dopant of the first conductivity type is grown epitaxially over the whole area.

7. The method as claimed in claim 1, in which a buried collector layer doped with a dopant of the second conductivity type is produced by implantation in the semiconductor wafer in the active transistor region, said collector layer serving for electrical connection of the collector.

8. The method as claimed in claim 1, in which $BF_2$ is implanted for the introduction of the dopant into the dielectric layer.

9. The method as claimed in claim 1, in which $BF_2$ can be indiffused into the dielectric layer from the gas phase.

10. The method as claimed in claim 4, in which the emitter layer is doped with arsenic, in which, during the indiffusion of the dopant into the base layer (BS), arsenic also indiffuses into a surface region of the base layer (BS) from the emitter (E).

11. The method as claimed in claim 4, in which the dielectric layer is removed after the patterning of the emitter layer and after the outdiffusion of the dopant in uncovered regions by etching.

12. The method as claimed in claim 4, further comprising the steps of:
  providing an n-doped semiconductor;
  growing a p-doped base layer epitaxially on the semiconductor wafer over the whole area;
  applying a dielectric layer in weakly doped or undoped fashion on the base layer;
  opening an emitter window in the dielectric layer;
  producing the emitter by application and patterning of an As-doped polycrystalline emitter layer above the emitter window;
  introducing $BF_2$ as the dopant into the dielectric layer with the aid of an implantation mask; and
  in a controlled thermal step, indiffusing boron from the dielectric layer into the base layer in the region of the extrinsic base, the latter acquiring low resistance, and simultaneously indiffusing arsenic into an upper region of the base layer from the emitter through the emitter window.

13. The method as claimed in claim 12, in which a photomask applied over an oxide layer over the emitter is used as the implantation mask, said photomask already having been used beforehand for the patterning of the emitter layer.

14. The method as claimed in claim 12, in which the collector connection is effected via an $n^+$-doped buried layer, and in which, over the emitter and in the region of the extrinsic base, the respective semiconductor is uncovered and metallic contacts are produced above the latter.

\* \* \* \* \*